United States Patent
Khangulov (12)

(10) Patent No.: US 6,391,646 B1
(45) Date of Patent: May 21, 2002

(54) PARAMAGNETIC RESONANCE METHOD FOR QUANTITATIVE DETERMINATION OF MOLECULAR OXYGEN AND ITS ISOTOPES

(75) Inventor: Sergi V. Khangulov, Princeton, NJ (US)

(73) Assignee: Sergei Khangulov, Princeton, NJ (US)

( * ) Notice: Subject to any disclaimer, the term of this patent is extended or adjusted under 35 U.S.C. 154(b) by 0 days.

(21) Appl. No.: 09/239,316

(22) Filed: Jan. 29, 1999

Related U.S. Application Data (60) Provisional application No. 60/073,504, filed on Feb. 3, 1998.

(51) Int. Cl.[7] .................. G01N 33/00; G01N 24/10
(52) U.S. Cl. .................. 436/136; 436/127; 436/173
(58) Field of Search ................. 436/127, 136, 436/173

(56) References Cited

U.S. PATENT DOCUMENTS

| | | | | |
|---|---|---|---|---|
| 4,516,984 A | * | 5/1985 | Warner et al. | 95/46 |
| 5,343,150 A | * | 8/1994 | Nakahata et al. | 324/316 |
| 5,431,901 A | * | 7/1995 | Halpern et al. | 424/9.33 |
| 5,532,145 A | * | 7/1996 | Tessman et al. | 435/91.2 |
| 5,765,562 A | * | 6/1998 | Leunbach et al. | 128/635.4 |

OTHER PUBLICATIONS

Journal of Biochemistry. "Direct Measurement of Superoxide Anion Produced in Biological System by ESR Spectrometry: A pH–Jump Method". pp. 983–987, Jul. 1990.*
Backer, J.M. et al., *Detection of the Kinetics of . . . Radicals*, Biochim, Biophys. Acta 460, 152–156 (1977).
Beringer, R. et al., *Microwave Magnetic Resonance . . . Oxygen*, Phys. Rev., 75, 1963 (1949).
Bjerre, N. et al., *Determinatin of Isotopic . . . Spectrometry*, Anal. Chem., 55, 2236–2238 (1983).
Cotton, F.A. t al., In: *Advanced Inorganic Chemisty* (John Wiley & Son, New York, 1966) pp. 591–599.
Evenson, K.M. et al., *Laser Magnetic Resonance . . . Lines*, Phy. Rev. A, vol. 6, No. 5, 2197–2204 (1972).
Goldberg, I.B. et al., *Electron Paramagnetic . . . Oxygen*, J. Phys. Chem., vol. 84, No. 23, 3040–3045 (1980).
Hebb, M.H., *On A–Type Doubling . . . b*, Phys. Rev. 49, 610–618 (1936).
Herzberg, G., *Molecular Spectra and Molecular Structure*, D. Van Nostrand Co. Inc., Princeton, Chap. V (1950).
Huston, J.L., *Chemical and Physical . . . Compounds*, Inorg. Chem. 1982, 21, 685–688.
Khangulov, S.V. et al., Biooganicheskaya Khimia 12, 741–748 (1986) Abstract.
Ligeza A. et al., Oxygen productin and consumption by chloroplasts in situ and in vitro as studied with microscopic spin label probes, Biochimica et Biophysica Acta 1186, pp. 201–208 (1994).
K. J. Liu, et al., Lithium phthalocyanine: A probe for electron paramagnetic resonance oximetry in viable biological systems, Proc. Natl. Acad. Sci. USA, vol. 90, pp 5438–5442, (Jun. 1993).
A. Meckler, Electronic Levels of Molecular Oxygen, Journal of Chemical Physics, vol. 21, No. 10, Oct. (1953).
M. Mizushima et al., Microwave Spectrum of $O_2$, Physical Review, Vol. 93, No. 4, (Feb. 1954).

(List continued on next page.)

Primary Examiner—Jill Warden
Assistant Examiner—LaToya I. Cross
(74) Attorney, Agent, or Firm—Blank Rome Comisky & McCauley LLP (57) ABSTRACT

An electron paramagnetic resonance spectroscopic method for quantifying molecular oxygen and its isotopes in a sample and an electron paramagnetic resonance spectrometric cell for use in this method are provided.

6 Claims, 9 Drawing Sheets

The protocol for determination of $O_2$-content in liquid samples *via* cell 1.

OTHER PUBLICATIONS

W. Rüttinger et al., Synthetic Water–Oxidation Catalysts for Artifical Photosynthetic Water Oxidation, Chemical Reviews, vol. 92, No. 1, (Jan./Feb. 1997).

T. Sarna, et al., Interaction of Melanin with Oxygen, Archives of Biochemistry and Biophysics, vol. 200, No. 1, pp. 140–148, (Mar., 1980).

R. Schlapp, Fine Structure in the $^3\Sigma$ Ground Stare of the Oxygen Molecule, and the Rotational Intensity Distribution in the atmospheric Oxygen Band, Physical Review, vol. 51, pp. 342–345, (Mar. 1, 1937).

W. Steinbach et al., Millimeter and Submillimeter Wave Spectrum of $^{18}O_2$, Physical Review A, vol. 8, No. 4, pp. 1753–1757, (Oct. 1973).

W. Steinbach et al., Microwave spectrum and molecular constants of $^{15}O^{18}O$, PHysical Review A, vol. 11, No. 3, pp 729–731, (Mar. 1975).

W. K. Subczynski et al., The Diffusion–concentration product of oxygen in lipid bilayers using the spin–label $T_1$ method, Biochemica et Biophysica acta, 643, pp. 283–291, (1981).

M. Tinkham et al., Theory of the fine structure of the molecular oxygen ground state, Physical Review, vol. 97, No. 4, pp 937–950, (Feb. 15, 1955).

M. Tinkham et al., Interaction of molecular oxygen with a magnetic field, Physical Review, vol. 97, No. 4, pp. 951–966, (Feb. 15, 1955).

J. H. Van Vleck, On o–type doubling and electron spin in the spectra of diatomic molecules, Physical Review, vol. 33, pp. 467–506, (Apr. 1929).

* cited by examiner

Fig. 1. Portion of EPR spectrum (6000-7500 G) of gaseous dioxygen at 25° C and microwave frequency of 9.46 GHz. Quantum transition relevant to lines #13, #16 and #19 are given in Table 1.

Fig.2A

12. Insert

6. Sample finger

Fig. 2. A. The EPR oxymetry cell 1. B. Placing of an insert 12 inside the finger 6. C. The glass finger with two compartments L and R. Compartment M provides a space for mixing of reagents. D. The modified part of the cell 1 including a buffer flask.

Fig. 3. The protocol for determination of $O_2$-content in liquid samples *via* cell 1.

Fig. 4. A. Normalized double integral of the EPR line #16, $\sigma_{\#16}$, *versus* the $O_2$ content for the cell with $\alpha=0.547$. The numbers 1, 2, 3, 5 and 7 indicate the number of m-cycles used to produce a set of different amounts of $O_2$ inside the cell 1 and used for this calibration. B. Dependence of peak-to-peak line width of the EPR line #16 on the $O_2$ content.

Fig. 5. Portion of the $O_2$ EPR spectra obtained from (a) the $O_2$ with the natural isotope composition and (b) from the gas mixture enriched with $^{16,18}O_2$ and $^{18}O_2$ isotopic forms. Dashed arrows indicates a few $^{16,18}O_2$ and $^{18}O_2$ EPR resonances Fig. 6. (a) Enlarged the $^{16}O_2$ EPR line #16 produced by gaseous dioxygen with natural isotope composition. (b) $^{16}O_2$, $^{16,18}O_2$ and $^{18}O_2^{\bullet}$ EPR lines #16 produced by gaseous dioxygen released upon hydrolysis of $XeF_4$ in the presence of $^{18}O$-enriched water (see text).

PARAMAGNETIC RESONANCE METHOD FOR QUANTITATIVE DETERMINATION OF MOLECULAR OXYGEN AND ITS ISOTOPES

This application claims priority of U.S. Provisional Application No. 60/073,504 filed on Feb. 3, 1998, the contents of which are incorporated herein.

INTRODUCTION

This invention was made with Government support under Grant No. DK45414, awarded by the national Institutes of Health. The Government has certain rights in this invention.

FIELD OF THE INVENTION

The present invention generally relates to an electron paramagnetic resonance spectroscopic method, particularly to the method for quantifying molecular oxygen and its isotopes in a sample and electron paramagnetic resonance spectrometric cell.

BACKGROUND OF THE INVENTION

Sophisticated techniques such as mass spectroscopy, infrared spectroscopy, ultraviolet spectroscopy and nuclear magnetic resonance spectroscopy are routinely used by chemists for various analytical applications. Electron paramagnetic resonance spectroscopy, or EPR, is a method of spectroscopic analysis that employs the resonance absorption of microwave energy by paramagnetic molecules or ions in a static magnetic field. EPR is also oftentimes referred to as electron spin resonance spectroscopy or ESR.

EPR (ESR) has become a powerful tool in the study of a wide range of organic compounds, reactions and biochemical processes. EPR also has been applied for investigation of reactions resulting in release or consumption of molecular oxygen (Swartz & Glockner 1989; Sarna et al., 1980; Subczynski & Hyde, 1981; Ligeza et al., 1994; Liu et al, 1995). In these methods, $O_2$ dissolved in liquids is measured indirectly by detection of an EPR signal from spin probes whose signal intensities have been correlated with the concentration of dissolved oxygen. Accordingly, these methods provide no data regarding isotope composition of molecular oxygen.

The X-band EPR signal of molecular oxygen in a gas phase was first observed in 1949 by Berlinger & Castle (Berlinger & Castle, 1949). At room temperature more then 99.9% of gas-phase $O_2$ molecules are in vibrationally non-exited ($\upsilon=0$) electronic ground $^3\Sigma_g^-$ state (Herzberg, 1950), revealing at pressure below 0.5 torr a multiline EPR signal shown in FIG. 1. The multiline EPR signal results from Zeeman transitions (K, J, M)→(K', J', M') of the total angular momentum J, which is formed by coupling between the electronic spin, S=1, and rotational angular K momentum of the $O_2$ molecule, J=S+K (Kramers, 1929; Van Vleck, 1929; Hebb, 1936; Schlapp, 1937; Meckler, 1953; Mizushima & Hill, 1954; Evenson & Mizushima, 1972; Steinbach, 1973; Steinbach, 1975).

An EPR method for determination of the isotopic composition of $O_2$ in a gas phase has been described by Bjerre and Larsen (Bjerre & Larsen, 1983). In this method samples of $^{18}O$-enriched $KBrO_3$ were placed in a quartz tube inserted in the microwave cavity of an EPR spectrometer and molecular oxygen was produced by thermal decomposition of $KBrO_3$. Accuracy of the isotopic composition of gaseous oxygen ($^{16}O_2$, $^{16,18}O_2$ and $^{18}O_2$) was determined by measurement of relative intensities of selected $O_2$ EPR lines in the range of 1–2%. The method, however, does not quantify the concentration of the oxygen isotopes in the sample and is limited to analysis of gaseous samples.

Accordingly, there is a need for method, which directly quantify $O_2$ isotopes, not only in gaseous samples, but also in liquid or solid samples.

SUMMARY OF THE INVENTION

An object of the present invention is to provide a sensitive method for determination of concentrations of different isotope forms of molecular oxygen by electron paramagnetic resonance without destruction of a sample. The method comprises a freezing of a liquid or solid sample placed in a sample finger of an oximetry cell; pumping out the atmosphere within the cell to a pressure below 0.01 torr; warming the frozen sample, so that any dissolved oxygen in the liquid or solid sample is released under vacuum in a gaseous phase into EPR finger portion; refreezing the remaining sample in the sample finger by placing the sample finger in the coolant mixture; placing the EPR finger wherein any oxygen gas resides in an X-band electron paramagnetic resonance spectrometer; and measuring the electron paramagnetic resonance spectrum of the oxygen molecules in the gas phase.

Another object of the present invention is to provide an oximetry cell comprising a closed sample finger connected by capillary to an EPR finger that is placed in the cavity of the EPR spectrometer.

With the foregoing and other objects, advantages and features of the invention that will become hereinafter apparent, the nature of the invention may be more clearly understood by reference to the following detailed description of the invention, the appended claims and to the several views illustrated in the drawings.

BRIEF DESCRIPTION OF THE DRAWINGS

FIG. 5 (a) is a portion of the $O_2$ EPR spectrum obtained from $O_2$ with a natural isotope composition; (b) shows a portion of the $O_2$ EPR spectrum obtained from a gas mixture enriched with $^{16,18}O_2$ and $^{18}O_2$ isotopic forms. Dashed arrows indicate a few $^{16,18}O_2$ and $^{18}O_2$ resonances.

FIG. 6 (a) is the enlarged EPR line #16 produced by gaseous dioxygen with natural isotope compositions; (b)

shows the enlarged $^{16}O_2$, $^{16, 18}O_2$ and $^{18}O_2$ EPR lines #16 produced by gaseous dioxygen released upon hydrolysis of $XeF_4$ in the presence of $^{18}O$-enriched water.

DETAILED DESCRIPTION OF THE INVENTION

Referring now in detail to the drawings wherein like parts are designated by like reference numerals throughout FIGS. 1–6.

The line shape of the $O_2$ EPR signal depends on the isotope composition of molecular oxygen. The present invention provides a method for quantification of the different isotopes forms of molecular oxygen in gas phase as well as $O_2$ dissolved in liquid and solid samples using EPR spectroscopy. This method involves transfer of molecular oxygen into the gas phase, followed by detection of the $O_2$ EPR signal.

Figure 1:
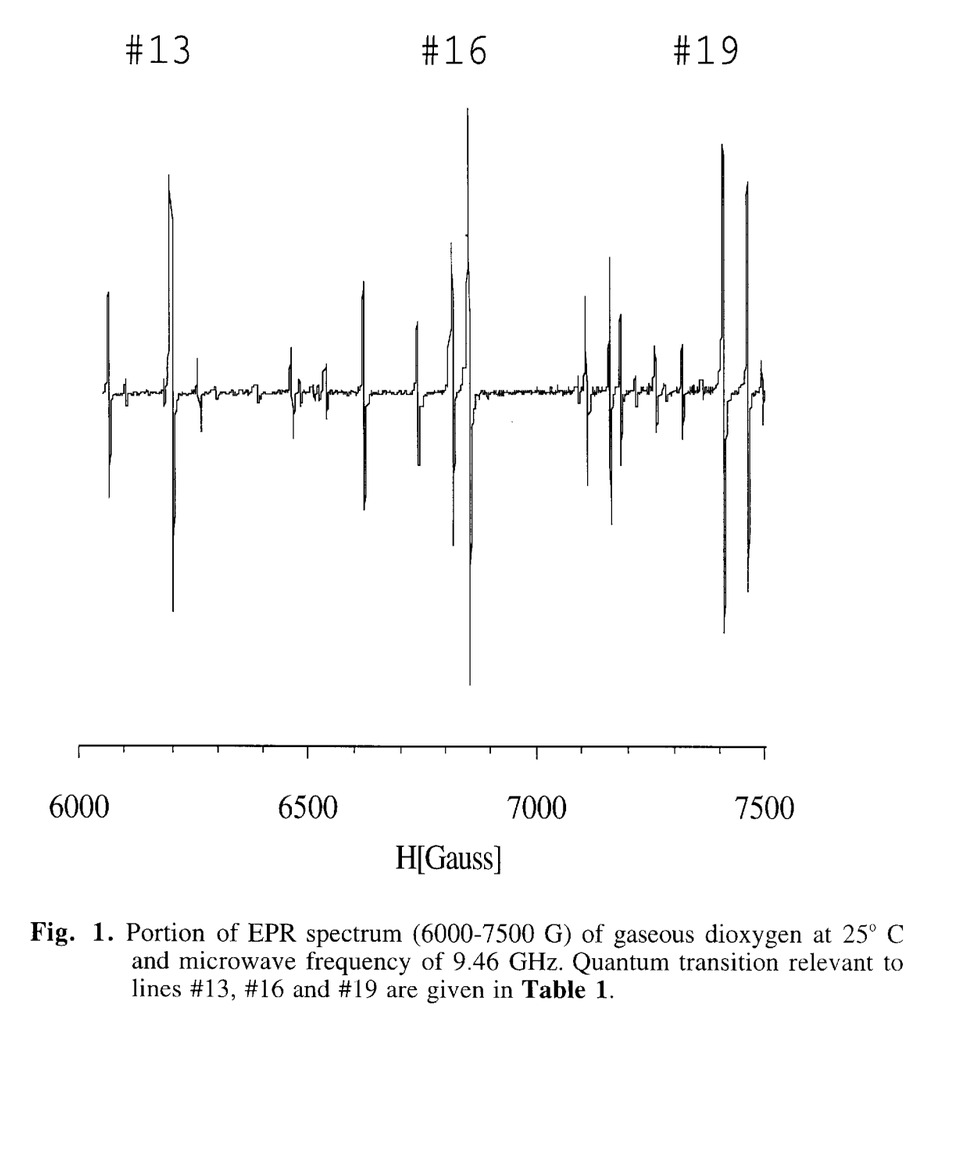
FIG. 1 is a portion of an EPR spectrum (6000–7500 G) of gaseous dioxygen at 25° C. and at a microwave frequency of 9.46 GHz.

Energy calculations of the molecules $O_2(^3\Sigma_g^-)$ made in the framework of the Born-Oppenheimer approximation result in a complete description of the $^{16}O_2$, $^{16}O^{18}O$ and $^{18}O_2$ EPR spectra (Tinkham & Strandberg, 1955a; Tinkham & Strandberg, 1955b; Goldberg & Laeger, 1980; Bjerre & Larsen, 1983) and provide an accurate prediction of intensities and positions of the individual EPR lines. A few $^{16}O_2$ EPR lines, corresponding to (K=1, J=2, $\Delta M=\pm 1$)-transitions and numbered in accordance with Goldberg and Laeger (1980) are shown in FIG. 1.

To perform the method of the present invention, a new EPR cell was designed and produced (FIG. 2). This EPR cell 1 comprises a sample finger 6, preferably comprised of glass, attached to the cell body via a vacuum seal 5 and includes an EPR finger 11, preferably comprised of quartz, connected to the sample finger 6 through first vacuum stopcock 3 and a capillary 4, preferably comprised of glass. One end of the EPR finger 11 is inserted into the EPR cavity of a spectrometer while the other end is fitted with a second vacuum stopcock 2 and connected to a vacuum pump via a pump attachment 10.

Figure 2A:
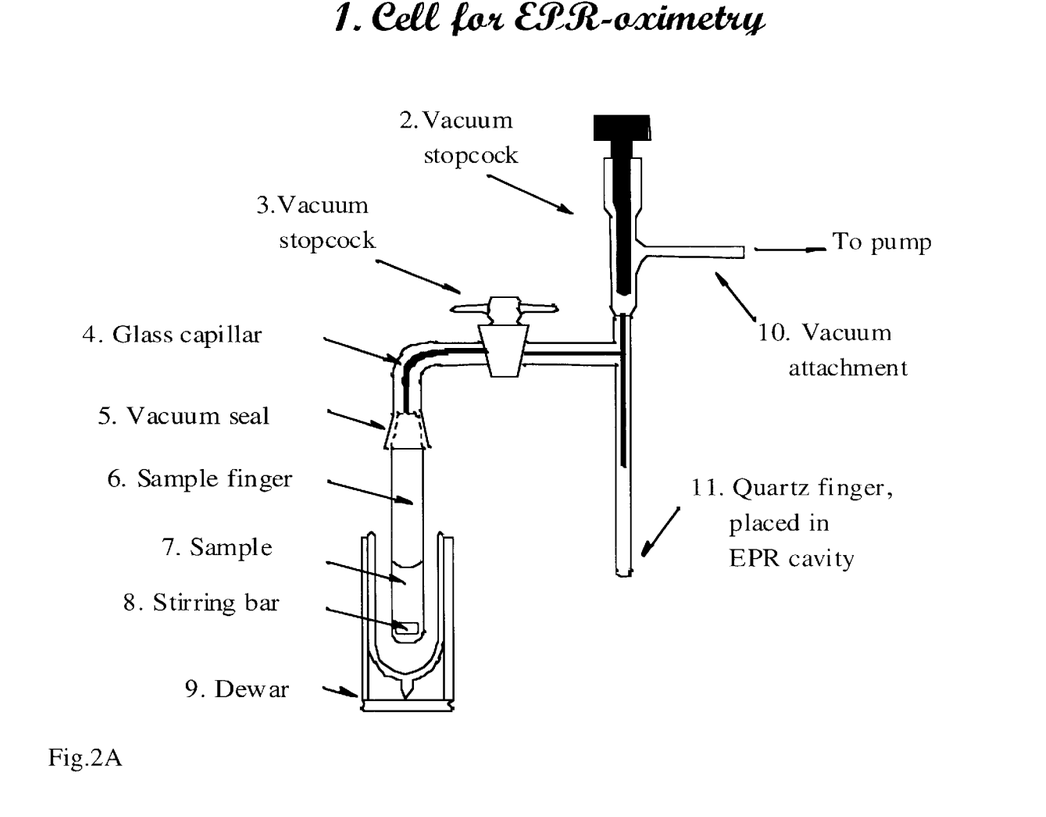
FIG. 2A is a schematic view of an EPR cell used in the method of the present invention.
Figure 2B:
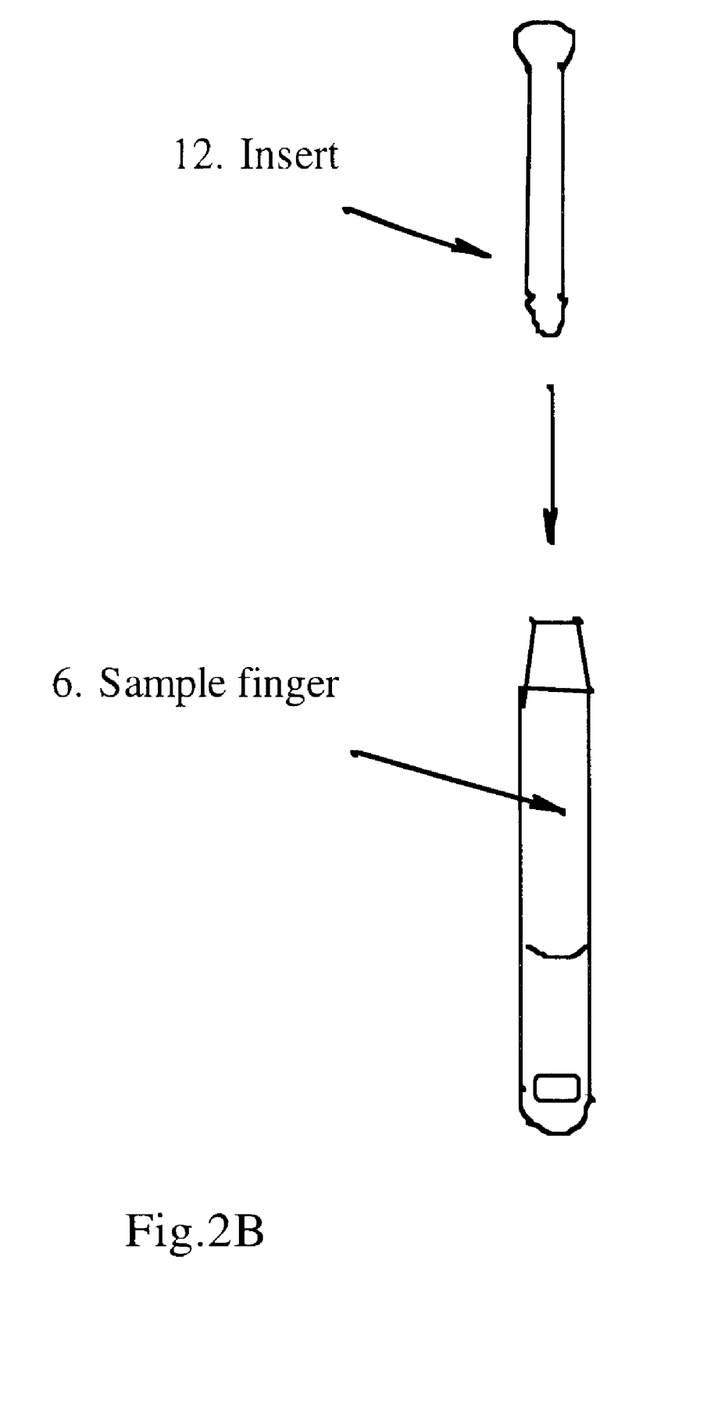
FIG. 2B is a schematic view of a sample finger and an insert for placement within the sample finger.
Figure 2C:
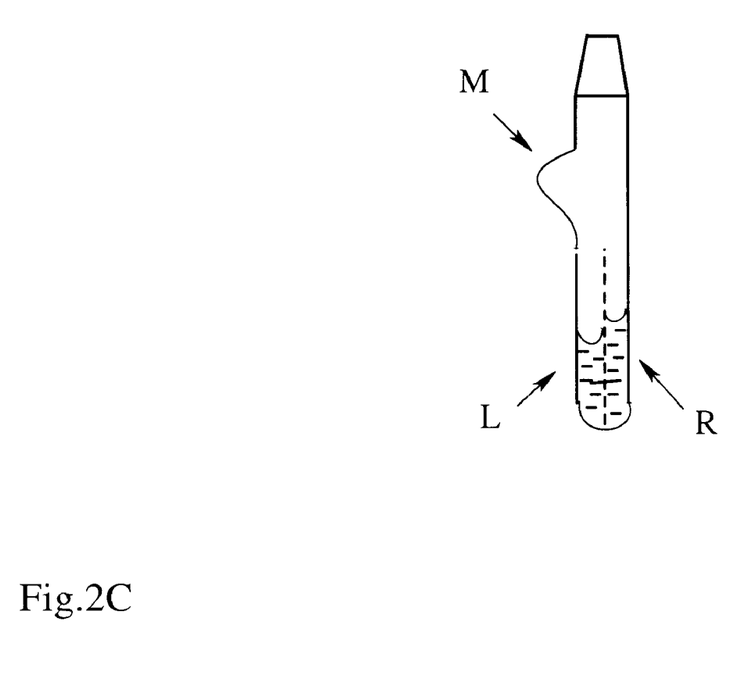
FIG. 2C is a modified sample finger with two separate compartments labeled L and R and a place for mixing of reagents labeled M.
Figure 2D:
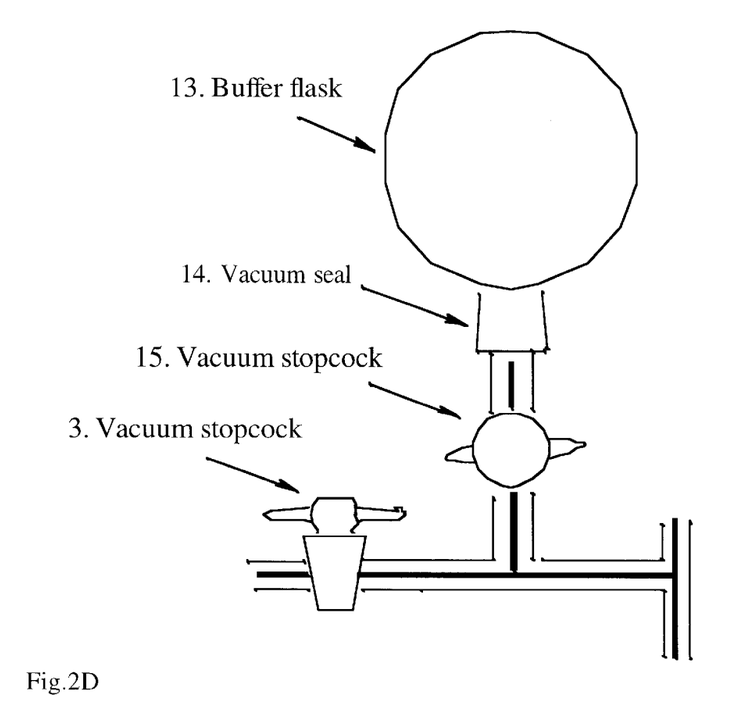
FIG. 2D is a modified portion of an EPR cell which includes a buffer flask.

As depicted in FIG. 2D, the cell may further comprise a buffer flask 13 positioned after a second vacuum seal 14 the vacuum stopcock 15. The flask 13 allows a substantial decrease in pressure in the oximetry cell to be made. Cell 1 of the present invention differs from traditional cells in that it permits measurement of liquid and solid samples as well as gaseous samples. As shown in FIG. 2A, the sample is placed in the sample finger 6, preferably along with a stirring bar. In one embodiment, as depicted in FIG. 2C, the sample finger 6 comprises several compartments.

Figure 3:
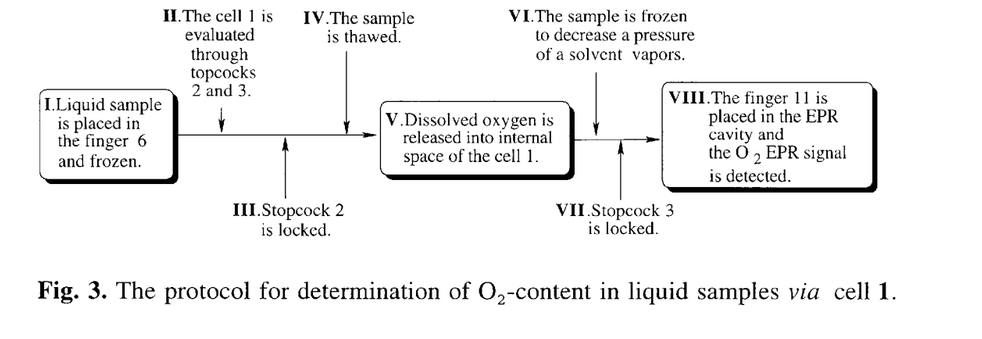
FIG. 3 is a schematic diagram of the protocol used for determination of $O_2$-content in liquid samples via the cell of FIG. 2A.
Figure 4:
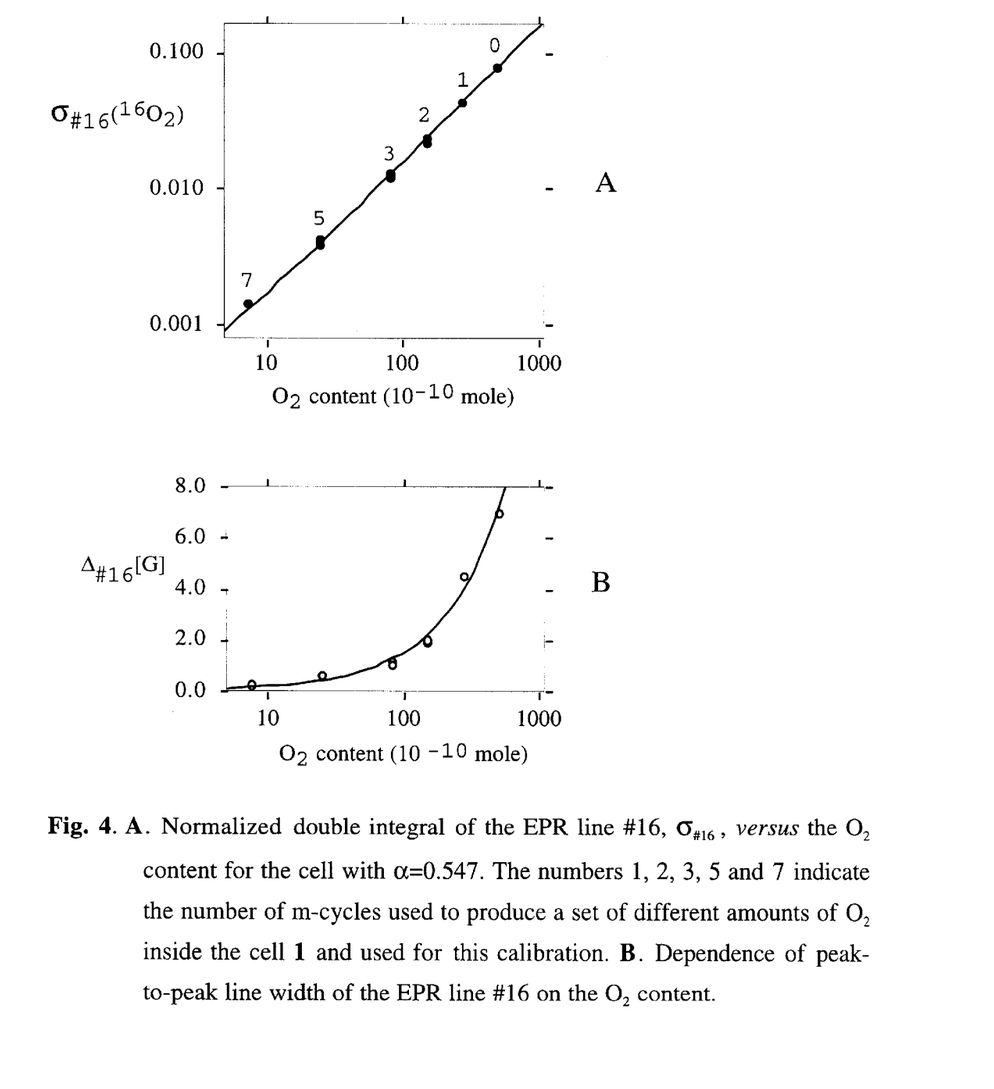
FIG. 4A is the dependence of the normalized double integral of the EPR line #16, $\sigma_{\#16}$, versus the $O_2$-content for the cell with $\alpha=0.547$. The numbers 1, 2, 3, 5 and 7 indicate the number of m-cycles used to produce a set of different amounts of $O_2$ inside the cell.
FIG. 4B is the dependence of peak-to-peak line width of the EPR line on the $O_2$-content.

A general protocol of the steps providing the transfer of molecular oxygen into the gas phase is illustrated by FIG. 3. A liquid sample to be analyzed is placed into the glass finger 6 of the cell 1 and frozen by placing of the bottom of the finger 6 in the coolant mixture (step I). Then, the sample finger 6, which contains the frozen sample, is evacuated below 0.01 torr through open stopcocks 2 and 3 (step II). After the stopcock 2 is closed (step III), the sample is thawed (step IV) and stirred for a selected time period with a magnetic bar to provide a complete release of the dissolved oxygen from the liquid into interior space of the cell (step IV). As will be obvious to those of skills in the art upon this disclosure, the stirring time will be dependent upon the sample volume; for example, a 0.2 ml sample has to be stirred for approximately 30 seconds. The sample is re-frozen in the coolant mixture (step VI), the stopcock 3 is closed (step VII), the EPR finger is placed into the EPR cavity and the spectrum of the molecular oxygen in the gas phase is detected (step VIII). To increase the sensitivity of the method, an insert 12, preferably comprised of glass, which consumes a portion of the empty space of the sample finger 6 can be inserted into the sample finger 6 as depicted in FIG. 2B.

Step VI has been shown to be most critical for quantification of gaseous dioxygen. This step decreases the pressure of solvent vapors and $CO_2$ which is naturally present in the analyzed solid or liquid materials, while keeping dioxygen in a gas phase. The step makes the oxygen resonances much sharper, increasing the sensitivity of the method.

The following organic solvents, ethanol, n-propyl alcohol and 2-methylbutan, cooled to their freezing points by liquid nitrogen have been shown to be suitable coolants for analysis of both water solutions and solids. Each of three coolants effectively freeze a water vapors and $CO_2$, leaving the released dioxygen in a gas phase. Steps I and VI could be also performed by placement of the bottom of the finger 6 in liquid nitrogen. In this case, caution should be taken because liquid nitrogen with temperature of $-196$ C, can, in principal, to freeze a gas-phase oxygen ($t_{frez}=-193°$ C. at atmospheric pressure). Accordingly, it is recommended that the level of the liquid nitrogen be kept about 3 mm below the surface of the analyzed frozen liquid to exclude the possibility of freezing gaseous oxygen on the interior walls of the sample finger 6.

EPR lines which could be used for accurate determination of different isotope forms $*O_2$, (e.g. for $^{16}O_2$, $^{16, 18}O_2$ and $^{18}O_2$) have been identified by Goldbeg and Laeder (Goldberg & Laeger, 1980; Bjerre & Larsen, 1983). The main EPR parameter used for quantifying of the $*O_2$ species is a normalized double integral of the individual line n of the $*O_2$ EPR spectrum, $\sigma_n^*$:

$$\sigma_n^* = S^* \times T/(B_m \times \sqrt{P})$$

where $S^*$ is a double integral of a single EPR line n, detected under unsaturated conditions; T, P and $B_m$ are temperature, microwave power and modulation amplitude, respectively. At low pressure, $*O_2$ concentration could be found from the following expression, $$[*O_2] = k_n \cdot \sigma_n^* / I_n^*$$

where $k_n$ and $I_n^*$ are a calibration coefficient and an isotope factor, respectively. The isotope factor $I_n^*$, allowing to compare concentrations of different $O_2$ isotopes, could be rationalized by the following expression:

$$I_n^* = \sigma'_n{}^* / \sigma'_n(^{16}O_2),$$

where, $\sigma'_n{}^*$ and $\sigma'_n(^{16}O_2)$ are the $\sigma$-values measured for the sample containing equal amounts $*O_2$ and $^{16}O_2$ forms, respectively. Naturally, that $I_n(^{16}O_2)=1$. The $I_n^*$-values for the lines #13, #16 and #19 are shown in Table 1.

TABLE 1

The $I_n^*$-values for three isotope forms of $O_2$ (Bjerre & Larsen, 1983).

| $n^a$ | K, J, ($M_i \rightarrow M_j$) | $*O_2$ | $I_n^*$ |
|---|---|---|---|
| #13 | 1, 2, (1 → 2) | $^{16}O_2$ | 1 |
|  |  | $^{16,18}O_2$ | 0.468 |
|  |  | $^{18}O_2$ | 0.872 |
| #16 | 1, 2, (0 → 1) | $^{16}O_2$ | 1 |
|  |  | $^{16,18}O_2$ | 0.468 |
|  |  | $^{18}O_2$ | 0.874 |

TABLE 1-continued

The $I_n^*$-values for three isotope
forms of $O_2$ (Bjerre & Larsen, 1983).

| $n^a$ | K, J, ($M_i \to M_j$) | $*O_2$ | $I_n^*$ |
|---|---|---|---|
| #19 | 1, 2, (−1 → 0) | $^{16}O_2$ | 1 |
| | | $^{16,18}O_2$ | 0.469 |
| | | $^{18}O_2$ | 0.877 |

$^a$magnetic field corresponding to the EPR line n could be found from eq. 5 in Ref. (Bjerre & Larsen, 1983).

The calibration coefficient $k_n$ in have to be determined experimentally via the following equation:

$$k_n = [^{16}O_2]_o / \sigma_n (^{16}O_2)_o,$$

where, $\sigma_n (^{16}O_2)_o$ is the $\sigma$-value measured for known concentration of gaseous $^{16}O_2$, $[^{16}O_2]_o$.

For calibration, the EPR signal of $O_2$ released from 0.2 ml $H_2O$ saturated with the air or $O_2$ gas (at 1 atm and 25° C.) was measured in accordance with the protocol shown in FIG. 3, providing a point "0" in FIG. 4A. The stopcock 3 was locked and the finger 11 was evaluated through the open stopcock 2. After vacuum stopcock 2 was locked and the stopcock 3 was open, the $O_2$ concentration inside the cell is $$[O_2] = \alpha \times [O_2]_o, \text{ where}$$

$$\alpha = (v_6 - v_i - v_7)/(v_6 - v_i - v_7 + v_{11})$$

and $v_6$, $v_i$, $v_7$ and $v_{11}$ are the volumes of the finger 6, the insert 12, the sample 7, and the finger 11, respectively. Repetition of the latter cycle allows to produce discrete set of $O_2$ concentrations $$[O_2] = \alpha^m \times [O_2]_o \quad (5c)$$

which were used for calibration (here, m is a number of cycle). Calibration diagram for cell 1 with $\alpha$-value of 0.55 ($v_6$, $v_i$, $v_7$ and $v_{11}$ are 2.57, 0.90, 0.20 and 1.20 ml, respectively, is shown in FIG. 4A. The diagram shows a strict linearity of the $\sigma_{\#16}$-value on concentration of gaseous $^{16}O_2$, despite of a substantial narrowing of the EPR line width upon the decrease of $O_2$ concentration, FIG. 4B.

Figure 5:
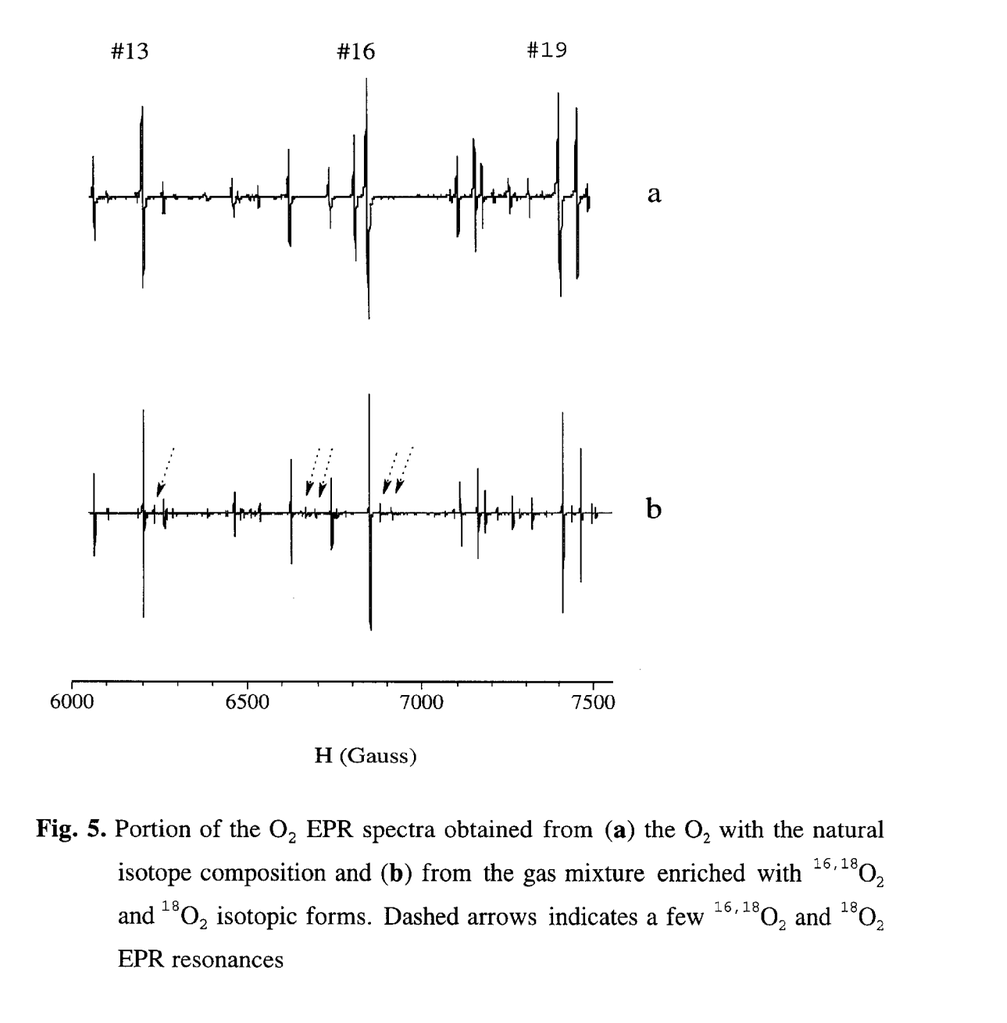
Figure 6:
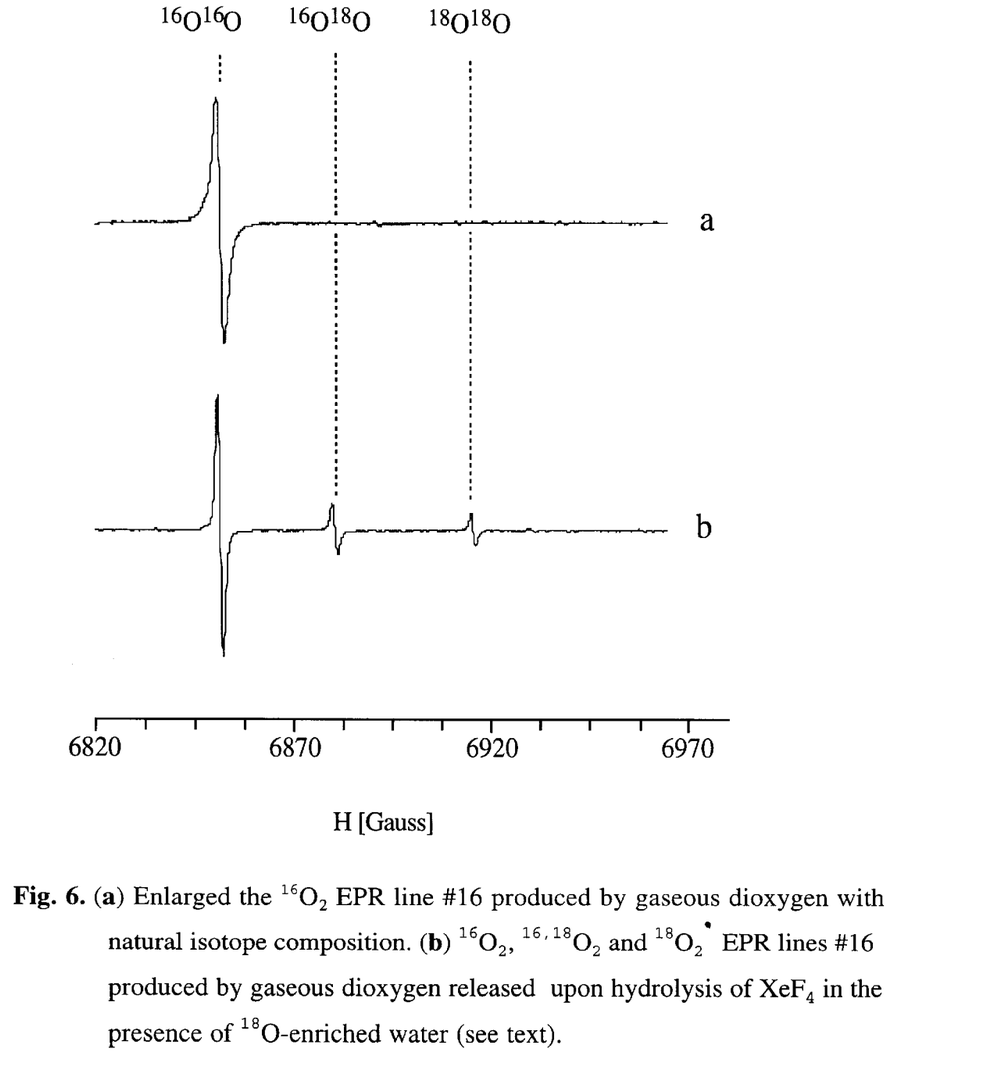

Successful application of the method was demonstrated in experiments with artificial catalysts simulating the process of photosynthetic oxygen evolution (Ruttinger & Dismukes, 1997), wherein the isotope composition of molecular oxygen evolved upon spontaneous hydrolysis of $XeF_4$ (Cotton, 1966; Huston, 1982) in $^{18}O$-labeled $H_2O$ 6 $XeF_4$+6 $H_2^{(18)}O \to 2$ $XeO_3$+4 $Xe$+24 $HF$+3$^{(18)}O_2$ has been measured. In these experiments, 0.1 ml of $^{18}O$-enriched $H_2O$ was placed inside of the finger 6 and then frozen. A small amount of solid $XeF_4$ (1.2 mg) was then placed on the surface of the ice and the cell 1 was evacuated. The reaction was started after the thawing of ice initiated by the placing the finger 6 in a water bath at 25° C. Comparison of the EPR signals of the "atmospheric" oxygen dissolved in water and the signal generated by $XeF_4$ are shown in FIGS. 5 and 6.

The ratio $[^{16,18}O_2]/[^{18}O_2]$, estimated by integration of the $^{16,18}O_2$ and $^{18}O_2$ EPR lines (FIG. 6b) is 2.91. The number corresponds to 45.5% $^{18}O$-enrichment, which is close to the 47% $^{18}O$-enrichment of the water sample used in this experiment. Because three EPR lines shown in FIG. 6b, are not overlapped, the presence of the dissolved "atmospheric" $O_2$ (predominantly $^{16}O_2$) does not interfere with the determination of $^{18}O$-labeled $O_2$ forms.

Sensitivity of the method of the present invention is limited by a "signal to noise" ratio and can be increased by accumulation of one EPR spectrum. If accumulation time do not exceed 1 h, the absolute sensitivity for each of three $O_2$ isotope forms is $10^{-11}$ moles. The sensitivity was estimated based on detection of the $^{16,18}O_2$ EPR signal in a gas mixture released from 0.2 ml of air-saturated water (1 atm, 25° C.), in which the $^{16,18}O_2$ form constitutes 0.2% of all dissolved $O_2$ molecules.

There are many different applications of the method of the present invention. For example, to analyze dioxygen in a gas mixture such as, but not limited to, atmospheric oxygen, exhaust, smokes, volcanic gases, gaseous products of different technologies or processes, the cell can be filled with the gas mixture. Solid samples can be also analyzed by the method of the present invention in accordance with the protocol. However, prior to the step I, the sample to be analyzed is placed in a sample finger containing frozen and degassed water (or an organic solvent) that is capable of dissolving the solid material. Plastic materials could be analyzed by placing a small piece of plastic directly in the finger 6 followed by procedures described in the protocol above.

Two-compartment glass finger 6 (as depicted in FIG. 2C) was used for investigation of the reaction products in reaction Mn-catalase with $KIO_4$ (Khangulov et al., 1986). In these experiments, $H_2^{18}O$-enriched buffer solutions (20 mM Na-phosphate, pH 7.3) of Mn-catalase (about 1 mg/ml) and 0.1 mM $KIO_4$ were placed in compartments L and R, respectively; then the procedures prescribed by the protocol in FIG. 3 was applied. The reaction was initiated by thawing of both solutions followed by their mixing in compartment or space M. No $^{18}O$-labeled dioxygen was detected, indicating that the reaction does not produce dioxygen.

A slightly modified cell design with a buffer flask 13 as depicted in FIG. 2D, was applied for determination of natural distribution of $^{16}O_2$ and $^{16,18}O_2$ in the atmospheric air. Prior to the measurement the buffer flask is evacuated. After the cell is filled with the atmospheric oxygen and the second vacuum stopcock 2 is locked, the flask 13 is open providing for substantial decrease of a pressure inside the oximetry cell, $$P = P_o v_c / (v_{buf} + v_c).$$

wherein, P, $P_o$, $v_{buf}$ and $v_c$ are the final pressure in the cell, initial pressure in the cell, the buffer volume and the cell 1 (without buffer) volume, respectively. Because a relatively large, 2000–3000 $cm^3$ flasks are required to decrease the 760 torr pressure below the 0.5 torr limit, in a preferred embodiment, smaller, 50–100 $cm^3$ flasks are used. In this case to achieve a pressure appropriate for detection of the $O_2$ EPR signal, the procedure outlined in FIG. 3 should be repeated one or more times. The modified cell 1 with the buffer flask allows for performance of a variety experiments, including the calibration procedure with atmospheric air or pure oxygen gas.

The method of the present invention thus provides a technique applicable to any situation wherein mass spectrometry is currently used for determination of molecular oxygen. However, the method of the present invention is very sensitive allowing for determination of extremely small amounts of molecular oxygen, i.e., $10^{-11}$ moles, and its isotopes. Accordingly, the method of the present invention is superior to mass spectrometry for the quantitative determination of oxygen content and isotope composition in small samples when the total amount of oxygen is small.

Thus, the method of the present invention is especially useful for screening samples such as pharmaceuticals, which are packed in glass vials under vacuum, for leakage of oxygen that would be indicative of product decomposition. This is made possible by the method of the present invention because both the glass vial and the sample remain intact during analysis Although certain presently preferred embodiments of the invention have been described herein, it will be apparent to those skilled in the art to which the invention pertains that variations and modifications of the described embodiment may be made without departing from the spirit and scope of the invention. Accordingly, it is intended that the invention be limited only to the extent required by appended claims and the applicable rules of law.

What is claimed is:

1. A method for quantifying concentration of molecular oxygen and its isotopes in a sample comprising the steps of:
   (a) freezing a sample in a sample finger of a cell;
   (b) contacting said freezing sample with $XeF_4$;
   (c) evacuating an atmosphere from the cell;
   (d) warming the frozen sample to release oxygen in said sample into an EPR finger of said cell;
   (e) refreezing said remaining sample in said sample finger of said cell;
   (f) placing the EPR finger of said cell in a cavity of an electron paramagnetic resonance spectometer; and
   (g) detecting an electron paramagnetic resonance spectrum of any oxygen molecules in said EPR finger of said cell.

2. The method of claim 1, wherein said cell placed in the electron paramagnetic resonance spectometer comprises:
   (a) an EPR finger having a bottom and a top, wherein the bottom is sized to fit cavity of said electron paramagnetic resonance spectometer and the top is connnected to a vacuum device via a first vacuum stopcock;
   (b) the first vacuum stopcock connecting the tops of said EPR finger to the vacuum device;
   (c) said sample finger having a bottom and a top located adjacent to said EPR finger;
   (d) capillary connecting the top of the sample finger to the top of said EPR finger; and
   (e) a second vacuum stopcock in the capillary.

3. The method of claim 1, wherein said sample is in a form of gas, liquid or solid phase.

4. The method of claim 1, wherein the atmosphere within said cell during step (c) is at a pressure below 0.01 torr.

5. The method of claim 1, wherein the refreezing step (e) is conducted in a coolant mixture.

6. The method of claim 5, wherein said coolant mixture is selected from the group consisting of ethanol, n-propyl alcohol, 2 methylbutan and combinations thereof.

* * * * *